United States Patent
Gupta et al.

(10) Patent No.: US 11,018,682 B1
(45) Date of Patent: May 25, 2021

(54) TIME-INTERLEAVED SUB-RANGING ANALOG-TO-DIGITAL CONVERTER

(71) Applicant: NXP B.V., Eindhoven (NL)

(72) Inventors: Sushil Kumar Gupta, Bangalore (IN); Pankaj Agrawal, Bangalore (IN); Ashish Panpalia, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/886,474

(22) Filed: May 28, 2020

(51) Int. Cl.
  *H03M 1/12* (2006.01)
  *H03M 1/14* (2006.01)
  *H03M 1/46* (2006.01)

(52) U.S. Cl.
  CPC .......... *H03M 1/145* (2013.01); *H03M 1/121* (2013.01); *H03M 1/462* (2013.01)

(58) Field of Classification Search
  CPC ....... H03M 1/145; H03M 1/121; H03M 1/462
  USPC ................. 341/155, 156, 120, 118
  See application file for complete search history.

(56) References Cited

U.S. PATENT DOCUMENTS

| | | | |
|---|---|---|---|
| 4,733,217 A * | 3/1988 | Dingwall | H03M 1/1215 341/122 |
| 8,884,801 B1 | 11/2014 | Ranjbar | |
| 9,331,706 B1 | 5/2016 | Ranjbar | |
| 10,630,304 B1 | 4/2020 | Trivedi et al. | |
| 2018/0013443 A1 | 11/2018 | Chao et al. | |

OTHER PUBLICATIONS

Shen, X. et al. "A 12-Bit 100-MSPS Pipelined-SAR ADC With a Time-Interleaved Second-Stage", IEEE International Conference on Solid-State and Integrated Circuit Technology, 3 pgs. (2014).
Eslami, M. et al. "A 1-V 690 μW 8-bit 200 MS/s Flash-SAR ADC with Pipelined Operation of Flash and SAR ADCs in 0.13μm CMOS", IEEE International Symposium on Circuits and Systems, pp. 289-292 (May 2015).
Kim, T. et al. "A 9-bit, 110-MS/s Pipelined-SAR ADC Using Time-Interleaved Technique with Shared Comparator", IEEE International System-on-Chip Conference, pp. 170-174 (Sep. 2015).

(Continued)

*Primary Examiner* — Peguy Jean Pierre
(74) *Attorney, Agent, or Firm* — Rajeev Madnawat

(57) ABSTRACT

A sub-ranging analog-to-digital converter (ADC) includes a coarse ADC and a fine ADC that receives a set of coarse signals from the coarse ADC. The fine ADC includes multiple digital-to-analog converters (DACs) and multiple converters such that a number of converters is less than a number of DACs. The DACs and the converters function in a partial time-interleaved manner where each DAC receives an analog input signal in different non-overlapping durations of a clock signal and generates a corresponding analog output signal. At least one of the converters is coupled with at least two DACs, and each converter is configured to receive the corresponding analog output signals and perform conversion operation to generate digital signals in non-overlapping durations of the clock signal, respectively. The durations for performing conversion operation of at least two of the converters overlap partially.

20 Claims, 9 Drawing Sheets

(56) References Cited

OTHER PUBLICATIONS

Kim, W. et al. "A 0.6 V 12 b 10 MS/s Low-Noise Asynchronous SAR-Assisted Time-Interleaved SAR (SATI-SAR) ADC", IEEE Journal of Solid-State Circuits, vol. 51, No. 8, pp. 1826-1839 (Aug. 2016).

Xing, D. et al. "Design of a High-Speed Time-Interleaved Sub-Ranging SAR ADC With Optimal Code Transfer Technique", IEEE Transactions on Circuits and Systems-I: Regular Papers, vol. 66, No. 2, pp. 489-501 (Feb. 2019).

Hu, H.-J. et al. "A 10-bit 1-GS/s 2x-interleaved Timing-Skew Calibration Free SAR ADC", IEEE International Symposim on Circuits and Systems (SCAS), 5 pgs. (May 2019).

\* cited by examiner

US 11,018,682 B1

TIME-INTERLEAVED SUB-RANGING ANALOG-TO-DIGITAL CONVERTER

BACKGROUND

The present disclosure relates generally to electronic circuits, and, more particularly, to analog-to-digital converters.

A conventional sub-ranging ADC performs a sampling operation of an analog input signal in a half cycle of a clock signal and coarse and fine conversion operations to generate a digital output signal in the next half cycle of the clock signal. To perform each of the coarse and fine conversion operations in a corresponding half cycle, high-powered coarse and fine ADCs are employed in the sub-ranging ADC. Due to the implementation of such high-powered components, a cost of such sub-ranging ADC is high.

A known solution to overcome the aforementioned problem includes implementing multiple sub-ADCs in a time-interleaved architecture in a sub-ranging ADC. Each sub-ADC includes corresponding coarse and fine ADCs to perform sampling and conversion operations such that the coarse and fine conversion operations are performed in more than one cycle of a clock signal. Further, the fine ADC includes multiple digital-to-analog converters (DACs) and multiple conversion circuits such that each conversion circuit converts a digital signal of an associated DAC to a corresponding analog signal. As a number of conversion circuits equals a number of DACs, a large area is consumed by the time-interleaved ADC on a system-on-chip (SoC). Further, as each conversion circuit includes a high-powered comparator, the power consumed by the time-interleaved sub-ranging ADC is high. Thus, a technical solution to solve the aforementioned problems of the conventional time-interleaved sub-ranging ADC is needed.

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

Figure 1A:
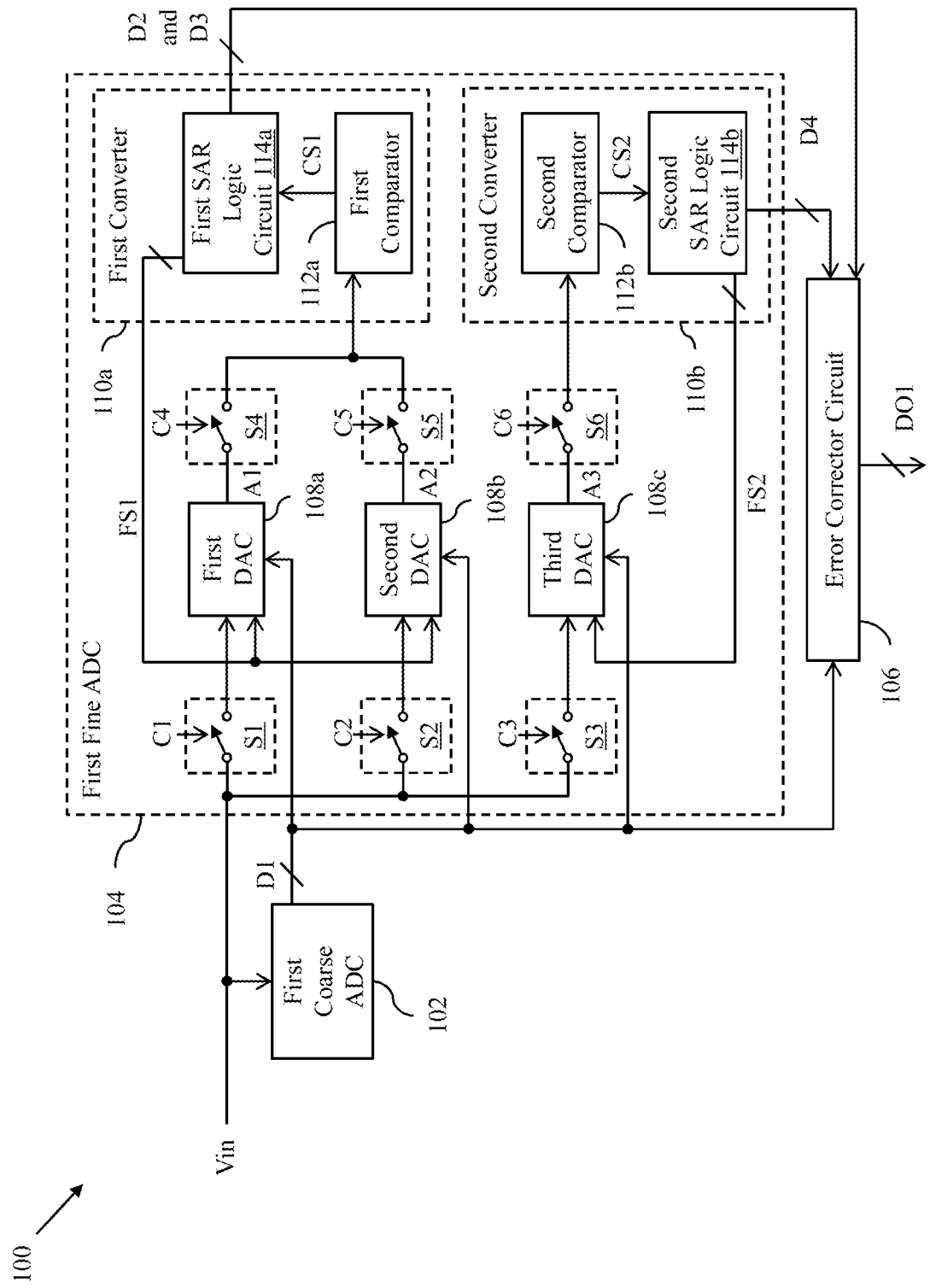
FIG. 1A is a block diagram of a first time-interleaved sub-ranging analog-to-digital converter (ADC) in accordance with an embodiment of the present disclosure.

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

In one embodiment, the present disclosure provides a sub-ranging analog-to-digital converter (ADC). The sub-ranging ADC includes a coarse ADC and a fine ADC that is coupled with the coarse ADC. The coarse ADC is configured to generate a set of coarse signals. The fine ADC includes first through third digital-to-analog converters (DACs) and first and second converters. The first through third DACs are configured to receive the set of coarse signals, receive an analog input signal for first through third durations of a clock signal, respectively, and generate first through third analog output signals, respectively. The first through third durations are non-overlapping durations. The first converter is coupled with the first and second DACs, and is configured to receive the first and second analog output signals and generate first and second digital signals in fourth and fifth durations of the clock signal, respectively. The fourth duration non-overlaps with the fifth duration. The second converter is coupled with the third DAC, and is configured to receive the third analog output signal and generate a third digital signal in a sixth duration of the clock signal. The sixth duration partially overlaps with at least one of the fourth and fifth durations.

In another embodiment, the present disclosure provides a sub-ranging ADC. The sub-ranging ADC includes first through third coarse ADCs and a fine ADC. The first through third coarse ADCs are configured to receive a set of analog signals and generate first through third sets of coarse signals, respectively. The fine ADC is coupled with the first through third coarse ADCs. The fine ADC includes first through third DACs and first and second converters. The first through third DACs are coupled with the first through third coarse ADCs, respectively, and are configured to receive the first through third sets of coarse signals, and an analog input signal for first through third durations of a clock signal, respectively, and generate first through third analog output signals, respectively. The first through third durations are non-overlapping durations. The first converter is coupled with the first and second DACs, and is configured to receive the first and second analog output signals and generate first and second digital signals in fourth and fifth durations of the clock signal, respectively. The fourth duration non-overlaps with the fifth duration. The second converter is coupled with the third DAC, and is configured to receive the third analog output signal and generate a third digital signal in a sixth duration of the clock signal. The sixth duration partially overlaps with at least one of the fourth and fifth durations.

Various embodiments of the present disclosure provide a sub-ranging ADC. The sub-ranging ADC includes a coarse ADC and a fine ADC. The coarse ADC is configured to generate a set of coarse signals. The fine ADC includes multiple DACs and multiple converters such that a number of converters is less than a number of DACs. The fine ADC is configured to receive the set of coarse signals and sample an analog input signal in corresponding non-overlapping durations of a clock signal. Based on the sampled analog input signal, the DACs are configured to generate multiple analog signals. At least one converter is coupled with more than one DAC, and is configured to receive the analog output signals and perform conversion operation to generate corresponding digital signals in non-overlapping durations of the clock signal, respectively. The durations for performing the conversion operation of at least two converters overlap partially.

The sub-ranging ADC utilizes one or more cycles of the clock signal to perform the fine conversion operation. Thus, a need for implementing a high-powered fine ADC that performs fine conversion in half cycle of a clock signal is eliminated. As multiple DACs and comparators form a partial time-interleaved architecture, the sub-ranging ADC operates at a higher speed as compared to conventional sub-ranging ADCs. Further, as at least one converter is used to convert analog signals of at least two DACs, the number of converters is less than the number of DACs in the sub-ranging ADC. Thus, the sub-ranging ADC consumes low area on a system-on-chip (SoC) and low power as compared to conventional time-interleaved sub-ranging ADCs that include an equal number of converters and DACs.

Referring now to FIG. 1A, a block diagram of a first time-interleaved sub-ranging analog-to-digital converter (ADC) 100 in accordance with an embodiment of the present disclosure is shown. The first time-interleaved sub-ranging ADC 100 is configured to receive an analog input signal Vin from a first functional circuitry (not shown). The first functional circuitry may be any analog circuitry that is configured to generate the analog input signal Vin. The analog input signal Vin may be indicative of a test signal, a functional signal, or the like. The first time-interleaved sub-ranging ADC 100 is further configured to convert the analog input signal Vin to generate a first digital output signal DO1, and may provide the first digital output signal DO1 to a second functional circuitry (not shown). The second functional circuitry may be any digital circuitry that is configured to receive the first digital output signal DO1 and perform operations related to display, testing, or the like. In one embodiment, the first and second functional circuitries and the first time-interleaved sub-ranging ADC 100 are included on a system-on-chip (SoC) (not shown).

The first time-interleaved sub-ranging ADC 100 includes a first coarse ADC 102, a first fine ADC 104, and an error corrector circuit 106. The first time-interleaved sub-ranging ADC 100 may further include a first clock generator circuit (not shown).

The first clock generator circuit is configured to generate an input clock signal (shown later in FIGS. 2, 4, 5, and 7). In the presently preferred embodiment, the first clock generator circuit is further configured to generate first through sixth clock signals C1-C6. In one example, the first through sixth clock signals C1-C6 are derived from the input clock signal by altering time durations of the input clock signal differently for each of the first through sixth clock signals C1-C6. Further, the second through sixth clock signals C2-C6 may be delayed versions of the first clock signal C1.

A duration for which the first through sixth clock signals C1-C6 remain at logic high state is less than a duration for which the first through sixth clock signals C1-C6 remain at logic low state.

The first through sixth clock signals C1-C6 remain at logic high state for first through sixth durations of the input clock signal, respectively. The first through third durations are non-overlapping durations, i.e., the first through third durations do not overlap with each other. Further, the fourth duration non-overlaps with the fifth duration, i.e., the fourth duration does not overlap with the fifth duration. Furthermore, the sixth duration partially overlaps with at least one of the fourth and fifth durations, i.e., the sixth duration and at least one of the fourth and fifth durations remain at the same logic state (such as logic high state) simultaneously when the sixth duration partially overlaps with at least one of the fourth and fifth durations, respectively. In one embodiment, the sixth duration and at least one of the fourth and fifth durations partially overlap for at least half cycle of the input clock signal. In one example, the sixth duration and at least one of the fourth and fifth durations partially overlap for half cycle of the input clock signal. In another example, the sixth duration and at least one of the fourth and fifth durations partially overlap for one cycle of the input clock signal.

Each of the first through third durations corresponds to at most one cycle of the input clock signal whereas each of the fourth through sixth durations corresponds to at least one cycle of the input clock signal. It will be apparent to a person skilled in the art that although in the current embodiment, the first clock generator circuit generates the first through sixth clock signals C1-C6, in another embodiment, the first time-interleaved sub-ranging ADC 100 includes second through seventh clock generator circuits (not shown) that are configured to receive the input clock signal and generate the first through sixth clock signals C1-C6, respectively.

It will further be apparent to those of skill in the art that although in the current embodiment, the first through sixth clock signals C1-C6 remain at logic high state for the first through sixth durations, respectively, in an alternate embodiment, the first through sixth clock signals C1-C6 remain at logic low state for the first through sixth durations, respectively.

The first coarse ADC 102 is configured to receive a set of analog signals that includes the analog input signal Vin, and perform coarse conversion of the set of analog signals to generate a first set of coarse signals that includes a first digital signal D1. Thus, the first coarse ADC 102 generates the first set of coarse signals based on the set of analog signals, i.e., by performing coarse conversion of the set of analog signals. The first coarse ADC 102 generates the first set of coarse signals in at least half cycle of the input clock signal. In one embodiment, the first coarse ADC 102 generates the first digital signal D1 in half cycle of the input clock signal. In another embodiment, the first coarse ADC 102 generates the first digital signal D1 in one cycle of the input clock signal. The first digital signal D1 includes a first set of bits, for example, N-bits, such that the most significant bits (MSBs) of the first digital output signal DO1 correspond to the first set of bits. The first coarse ADC 102 is coupled to the first fine ADC 104, and is further configured to provide the first set of coarse signals. i.e., the first digital signal D1, to the first fine ADC 104. In one example, the first coarse ADC 102 is implemented as a flash ADC.

The first fine ADC 104 is coupled with the first functional circuitry and the first coarse ADC 102, and is configured to receive the analog input signal Vin and the first digital signal D1. Based on the first digital signal D1 and the analog input signal Vin, the first fine ADC 104 is further configured to perform fine conversion to generate second through fourth digital signals D2-D4 in the fourth through sixth durations of the input clock signal. The second through fourth digital signals D2-D4 include second through fourth sets of bits such that least significant bits (LSBs) of the first digital output signal DO1 correspond to at least one of the second through fourth sets of bits. In one example, each of the second through fourth sets of bits includes M-bits. The first fine ADC 104 includes first through third switches S1-S3, first through third digital-to-analog converters (DACs) 108a-108c, fourth through sixth switches S4-S6, a first converter 110a, and a second converter 110b.

The first through third switches S1-S3 are coupled with the first functional circuitry, and are configured to receive the analog input signal Vin and the first through third clock signals C1-C3, respectively. The first through third switches S1-S3 are activated in the first through third durations of the input clock signal, i.e., when the first through third clock signals C1-C3 are at logic high state, respectively.

It will be apparent to those of skill in the art that although in the current embodiment, the first through third switches S1-S3 are activated when the first through third clock signals C1-C3 are at logic high state, respectively, in an alternate embodiment, the first through third switches S1-S3 are activated when the first through third clock signals C1-C3 are at logic low state, respectively. In one example, each switch is a p-channel metal oxide semiconductor transistor. In another example, each switch is a n-channel metal oxide semiconductor transistor.

The first through third switches S1-S3 receive and sample the analog input signal Vin when the first through third switches S1-S3 are activated, respectively. The first through third switches S1-S3 are coupled with the first through third DACs 108a-108c, respectively, and are further configured to provide the sampled analog input signal Vin to the first through third DACs 108a-108c, respectively. In the presently preferred embodiment, though the first through third switches S-S3 are internal to the first fine ADC 104 and external to the first through third DACs 108a-108c, in another embodiment, the first through third switches S-S3 are external to the first fine ADC 104. In yet another embodiment, the first through third switches S1-S3 are internal to the first through third DACs 108a-108c, respectively.

The first through third DACs 108a-108c are coupled to the first coarse ADC 102, and are configured to receive the first set of coarse signals, i.e., the first digital signal D1. The first through third DACs 108a-108c are further configured to receive the sampled analog input signal Vin for the first through third durations of the input clock signal, i.e., when the first through third switches S1-S3 are activated, respectively. Further, the first through third DACs 108a-108c are configured to generate first through third analog output signals A1-A3 on receiving the sampled analog input signal Vin, respectively. In the presently preferred embodiment, the first through third DACs 108a-108c are capacitive DACs that include a set of capacitors (not shown). The first and second DACs 108a and 108b further receive a first feedback signal FS1. The first feedback signal FS1 controls charging and discharging of the set of capacitors of the first and second DACs 108a and 108b, respectively, i.e., controls the first and second DACs 108a and 108b for generating the first and second analog output signals A1 and A2, respectively. The third DAC 108c further receives a second feedback signal FS2. The second feedback signal FS2 controls charging and discharging of the set of capacitors of the third DAC 108c, i.e., controls the third DAC 108c for generating the third analog output signal A3. It will be apparent to those of skill in the art that although in the current embodiment, the first fine ADC 104 includes the first through third DACs 108a-108c, in alternate embodiments, the first fine ADC 104 may include more than three DACs without deviating from the scope of the present disclosure.

The fourth through sixth switches S4-S6 are coupled with the first through third DACs 108a-108c, respectively, and are configured to receive the first through third analog output signals A1-A3 and the fourth through sixth clock signals C4-C6, respectively. The fourth and fifth switches S4 and S5 are activated in the fourth and fifth durations of the input clock signal, i.e., when the fourth and fifth clock signals C4 and C5 are at logic high state, respectively. The sixth switch S6 is activated in the sixth duration of the input clock signal, i.e., when the sixth clock signal C6 is at logic high state. The fourth switch S4 receives and outputs the first analog output signal A1 when the fourth switch S4 is activated. Similarly, the fifth and sixth switches S5 and S6 receive and output the second and third analog output signals A2 and A3 when the fifth and sixth switches S5 and S6 are activated, respectively. The fourth and fifth switches S4 and S5 are coupled with the first converter 110a, and are further configured to provide the first and second analog output signals A1 and A2 to the first converter 110a, respectively. The sixth switch S6 is coupled with the second converter 110b, and is further configured to provide the third analog output signal A3 to the second converter 110b.

It will be apparent to those of skill in the art that although in the current embodiment, the fourth through sixth switches S4-S6 are activated when the fourth through sixth clock signals C4-C6 are at logic high state, respectively, in an alternate embodiment, the fourth through sixth switches S4-S6 are activated when the fourth through sixth clock signals C4-C6 are at logic low state, respectively.

The first converter 110a is coupled to the first and second DACs 108a and 108b by way of the fourth and fifth switches S4 and S, respectively, and is configured to receive the first and second analog output signals A1 and A2. The first converter 110a converts the first and second analog output signals A1 and A2 to generate the second and third digital signals D2 and D3 in the fourth and fifth durations, respectively. Further, the first converter 110a is configured to generate and provide the first feedback signal FS1 to the first and second DACs 108a and 108b to control the first and second DACs 108a and 108b, respectively.

The first converter 110a includes a first comparator 112a and a first successive approximation register (SAR) logic circuit 114a. The first comparator 112a is coupled with the fourth and fifth switches S4 and S5. Thus, the first comparator 112a is coupled to the first and second DACs 108a and 108b by way of the fourth and fifth switches S4 and S5, and is configured to receive the first and second analog output signals A1 and A2, respectively. The first comparator 112a is further configured to generate a first comparison signal CS1 based on at least one of the first and second analog output signals A1 and A2.

To generate the first comparison signal CS1, the first comparator 112a receives and compares at least one of the first and second analog output signals A1 and A2 with a first reference signal (not shown) when at least one of the fourth and fifth switches S4 and S5 is activated, respectively. The first reference signal is generated by a reference signal generator (not shown). In one embodiment, the reference signal generator corresponds to a bandgap circuit. Further, a voltage level of the first reference signal is equal to a common mode voltage level of the analog input signal Vin when the first and second DACs 108a and 108b are top-plate sampling DACs. Alternatively, when the first and second DACs 108a and 108b are bottom-plate sampling DACs, the first reference signal is at a voltage level that is half of a supply voltage (not shown). The first comparator 112a compares one of the first and second analog output signals A1 and A2 with the first reference signal at each cycle of a comparison clock signal (not shown). In one example, when the fourth switch S4 is activated, the first comparator 112a compares the first analog output signal A1 with the first reference signal to generate the first comparison signal CS1. Similarly, when the fifth switch S5 is activated, the first comparator 112a compares the second analog output signal A2 with the first reference signal to generate the first comparison signal CS1. The number of cycles for comparison are based on the number of bits of one of the second and third digital signals D2 and D3. In one example, the first comparator 112a performs the comparison for M-cycles of the comparison clock signal when the corresponding digital signal includes M-bits. In one embodiment, the comparison clock signal is generated by the first clock generator circuit.

The first SAR logic circuit 114a is coupled with the first comparator 112a and the first and second DACs 108a and 108b. The first SAR logic circuit 114a is configured to receive the first comparison signal CS1. The first comparator 112a and the first SAR logic circuit 114a are configured to successively approximate the first and second analog output signals A1 and A2 to generate the second and third digital signals D2 and D3, respectively. The first SAR logic circuit 114a is further configured to generate the first feedback signal FS1 at each cycle of the comparison clock signal, and provide the first feedback signal FS1 to the first and second DACs 108a and 108b. After each cycle of the comparison clock signal, the first SAR logic circuit 114a generates a corresponding bit of one of the second and third digital signals D2 and D3. Thus, after M-cycles of the comparison clock signal, the first SAR logic circuit 114a completes generation of the M-bits of one of the second and third digital signals D2 and D3. The first SAR logic circuit 114a generates the second and third digital signals D2 and D3 in the fourth and fifth durations of the input clock signal, i.e., when the fourth and fifth switches S4 and S5 are activated, respectively.

The second converter 110b is coupled to the third DAC 108c by way of the sixth switch S6, and is configured to receive and convert the third analog output signal A3 to generate the fourth digital signal D4 in the sixth duration. Further, the second converter 110b is configured to generate and provide the second feedback signal FS2 to the third DAC 108c to control the third DAC 108c.

The second converter 110b includes a second comparator 112b and a second SAR logic circuit 114b. The second comparator 112b is coupled with the sixth switch S6. Thus, the second comparator 112b is coupled to the third DAC 108c by way of the sixth switch S6, and is configured to receive the third analog output signal A3. The second comparator 112b is further configured to generate a second comparison signal CS2 based on the third analog output signal A3. It will be understood by those of skill in the art that the second comparator 112b generates the second comparison signal CS2 in a manner similar to the generation of the first comparison signal CS1 by the first comparator 112a.

The second SAR logic circuit 114b is coupled with the second comparator 112b and the third DAC 108c. The second SAR logic circuit 114b is configured to receive the second comparison signal CS2. The second comparator 112b and the second SAR logic circuit 114b are configured to successively approximate the third analog output signal A3 to generate the fourth digital signal D4. The second SAR logic circuit 114b is further configured to generate the second feedback signal FS2 at each cycle of the comparison clock signal, and provide the second feedback signal FS2 to the third DAC 108c. After each cycle of the comparison clock signal, the second SAR logic circuit 114b generates a corresponding bit of the fourth digital signal D4. Thus, after M-cycles of the comparison clock signal, the second SAR logic circuit 114b completes generation of the M-bits of the fourth digital signal D4. The second SAR logic circuit 114b generates the fourth digital signal D4 in the sixth duration of the input clock signal, i.e., when the sixth switch S6 is activated.

The error corrector circuit 106 is coupled with the first coarse ADC 102 and the first and second SAR logic circuits 114a and 114b, and is configured to receive the first set of coarse signals, i.e., the first digital signal D1, and the second through fourth digital signals D2-D4. The error corrector circuit 106 is further configured to generate the first digital output signal DO1 based on the first set of coarse signals, i.e., the first digital signal D1, and at least one of the second through fourth digital signals D2-D4. In one example, the error corrector circuit 106 receives the first and second digital signals D1 and D2 and generates the first digital output signal DO1 based on the first and second digital signals D1 and D2. To generate the first digital output signal DO1, the error corrector circuit 106 is further configured to compare the LSB of the first digital signal D1 with the MSB of the second digital signal D2 to determine whether the LSB of the first digital signal D1 matches the MSB of the second digital signal D2. Based on the determination, the error corrector circuit 106 is further configured to check whether the first and second digital signals D1 and D2 are error-free or erroneous. The first and second digital signals D1 and D2 are error-free when the LSB of the first digital signal D1 matches the MSB of the second digital signal D2. The first and second digital signals D1 and D2 are erroneous when the LSB of the first digital signal D1 does not match with the MSB of the second digital signal D2. The error corrector circuit 106 is further configured to correct the errors in at least one of the first and second digital signals D1 and D2 when at least one of the first and second digital signals D1 and D2 are erroneous. Thus, the error corrector circuit 106 generates and outputs the first digital output signal DO1 based on the first and second digital signals D1 and D2 when the first and second digital signals D1 and D2 are error-free.

It will be apparent to a person skilled in the art that the number of bits of the first digital output signal DO1 are based on the number of bits of the first and second digital signals D1 and D2. In an example, when the first digital signal D1 is of N-bits and the second digital signal D2 is of M-bits, the first digital output signal DO1 is of (N+M−1) bits. It will be further apparent to those of skill in the art that when the error corrector circuit 106 receives one of the third and fourth digital signals D3 and D4, the error corrector circuit 106 generates the first digital output signal DO1 based on one of the third and fourth digital signals D3 and D4 in a manner similar to the generation of the first digital output signal DO1 based on the second digital signal D2.

Figure 1B:
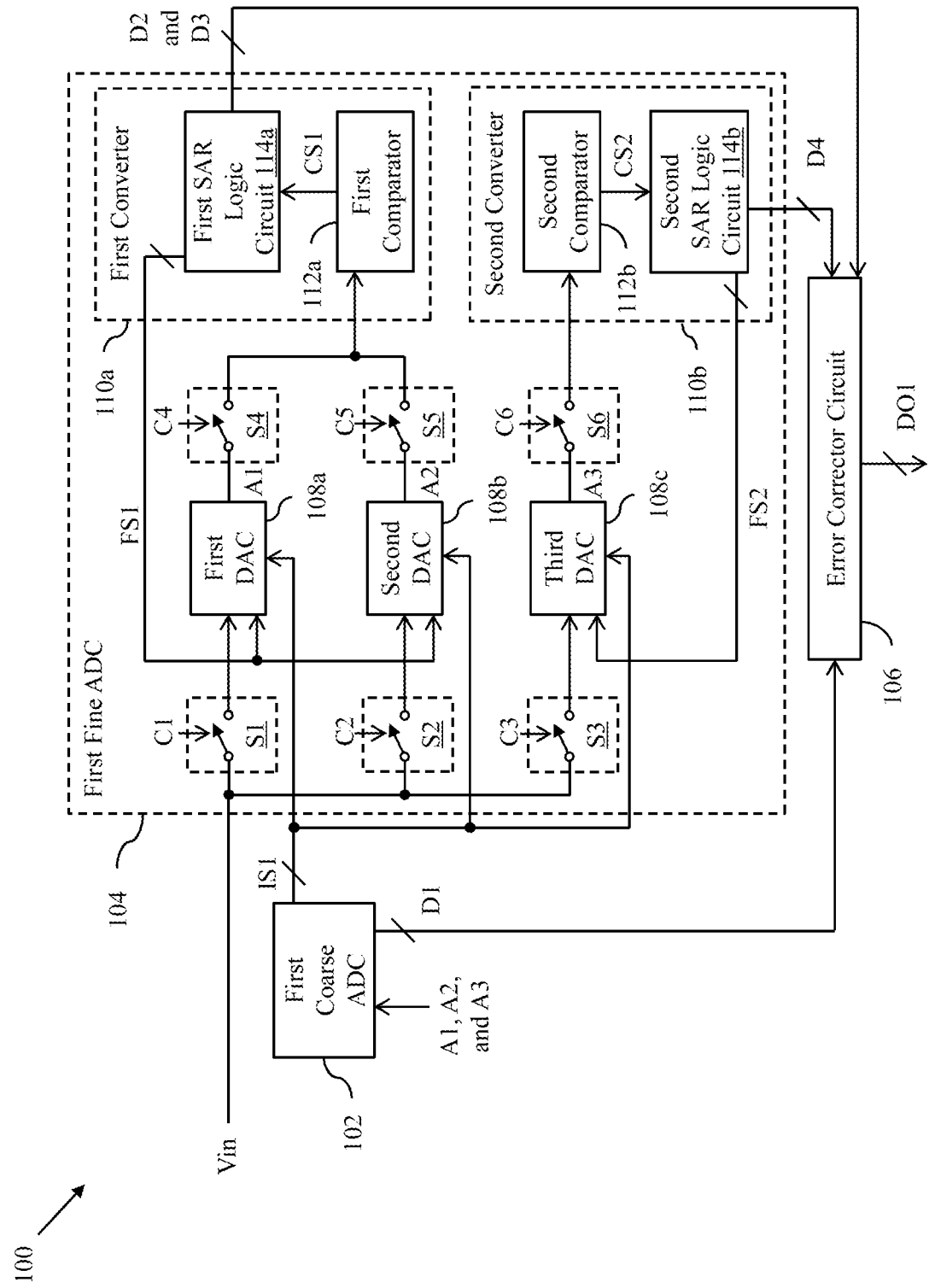
FIG. 1B is a block diagram of the first time-interleaved sub-ranging ADC of FIG. 1A in accordance with another embodiment of the present disclosure.

Referring now to FIG. 1B, a block diagram of the first time-interleaved sub-ranging ADC 100 in accordance with another embodiment of the present disclosure is shown. In the embodiment, the first coarse ADC 102 is implemented as a SAR ADC and shares the first through third DACs 108a-108c of the first fine ADC 104 for performing coarse conversion. The first coarse ADC 102 is configured to receive a set of analog signals (such as the first through third analog output signals A1-A3). Based on one of the first through third analog output signals A1-A3, the first coarse ADC 102 generates a second set of coarse signals, i.e., a first intermediate signal IS1 and the first digital signal D1. The first coarse ADC 102 includes a third comparator (not shown) and a third SAR logic circuit (not shown).

The third comparator is coupled with the first through third DACs 108a-108c, and is configured to receive the first through third analog output signals A1-A3. The third comparator is further configured to generate a third comparison signal (not shown) based on at least one of the first through third analog output signals A1-A3. It will be understood by those of skill in the art that the third comparator generates the third comparison signal in a manner similar to the generation of the first comparison signal CS1 by the first comparator 112a.

The third SAR logic circuit is coupled with the third comparator and the first through third DACs 108a-108c. The third SAR logic circuit is configured to receive the third comparison signal, generate the first intermediate signal IS1 based on the third comparison signal, and provide the first intermediate signal IS1 to the first through third DACs 108a-108c. The first through third DACs 108a-108c are configured to receive the first intermediate signal IS1 as the second set of coarse signals. The first intermediate signal IS1 controls the generation of the first through third analog output signals A1-A3 for performing coarse conversion. The third comparator and the third SAR logic circuit are configured to successively approximate at least one of the first through third analog output signals A1-A3 to generate the first digital signal D1. The first digital signal D1 is generated by converting one of the first through third analog output signals A1-A3. The first coarse ADC 102 generates the second set of coarse signals, i.e., the first digital signal D1 and the first intermediate signal IS1, in at least half cycle of the input clock signal. The error corrector circuit 106 is coupled with the first coarse ADC 102, and is configured to receive the second set of coarse signals. The error corrector circuit 106 receives the first digital signal D1 as the second set of coarse signals. The first fine ADC 104 and the error corrector circuit 106 function in a similar manner as described in FIG. 1A.

Figure 2:
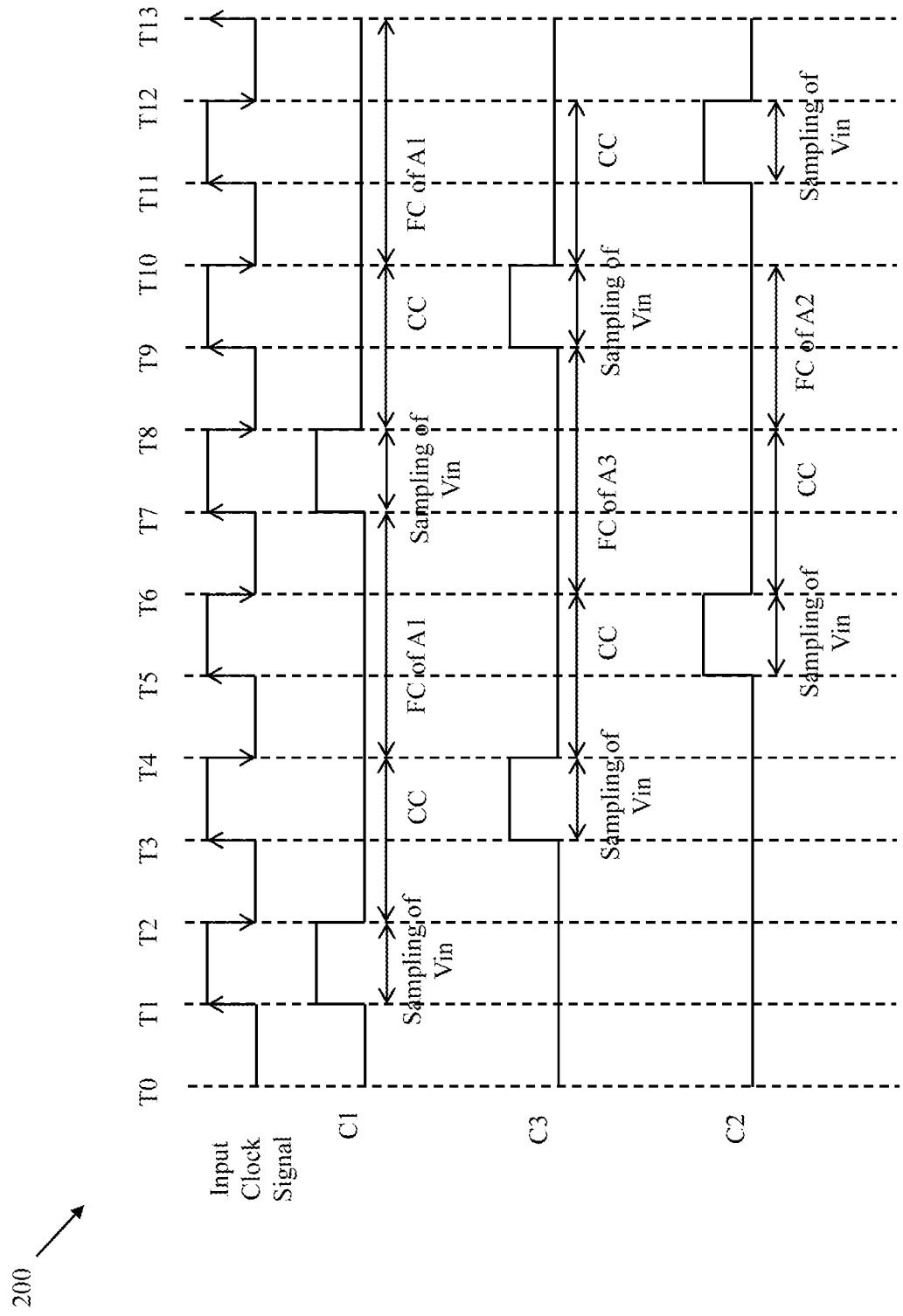
FIG. 2 is a timing diagram that illustrates an operation of the first time-interleaved sub-ranging ADC of FIGS. 1A and 1B in accordance with an embodiment of the present disclosure.

Referring now to FIG. 2, a timing diagram 200 illustrating an operation of the first time-interleaved sub-ranging ADC 100 of FIGS. 1A and 1B in accordance with an embodiment of the present disclosure is shown. In the embodiment, each of the first through third durations corresponds to a half cycle of the input clock signal, each of the fourth and fifth durations corresponds to one and a half cycle of the input clock signal, and the sixth duration corresponds to one cycle of the input clock signal.

At time instance T0, the first through third clock signals C1-C3 are at logic low state, thus, the first through third switches S1-S3 are deactivated. During time period T0-T1, the first through third clock signals C1-C3 remain at logic low state and the first through third switches S1-S3 remain deactivated.

At time instance T1, the first clock signal C1 transitions from logic low state to logic high state, thereby activating the first switch S1. During time period T1-T2, the first clock signal C1 remains at logic high state, and the second and third clock signals C2 and C3 remain at logic low state. Thus, the first switch S1 remains activated and the second and third switches S2 and S3 remain deactivated. The first switch S1 thus performs sampling of the analog input signal Vin. Further, the first DAC 108a receives the sampled analog input signal Vin and generates the first analog output signal A1.

At time instance T2, the first clock signal C1 transitions from logic high state to logic low state, thereby deactivating the first switch S1. During time period T2-T3, the first through third clock signals C1-C3 remain at logic low state and the first through third switches S1-S3 remain deactivated.

At time instance T3, the third clock signal C3 transitions from logic low state to logic high state, thereby activating the third switch S3. During time period T3-T4, the third clock signal C3 remains at logic high state, and the first and second clock signals C1 and C2 remain at logic low state. Thus, the third switch S3 remains activated, and the first and second switches S1 and S2 remain deactivated. The third switch S3 thus performs sampling of the analog input signal Vin. Further, the third DAC 108c receives the sampled analog input signal Vin and generates the third analog output signal A3. During time period T2-T4, in reference to FIG. 1A, the first coarse ADC 102 performs coarse conversion (represented as "CC" in FIG. 2) of the analog input signal Vin to generate the first digital signal D1. In reference to FIG. 1B, the first coarse ADC 102 performs coarse conversion (represented as "CC" in FIG. 2) of the first analog output signal A1 to generate the first digital signal D1. Further, the coarse conversion of the second and third analog output signals A2 and A3 are represented as "CC" in FIG. 2.

At time instance T4, the third clock signal C3 transitions from logic high state to logic low state, thereby deactivating the third switch S3. During time period T4-T5, the first through third clock signals C1-C3 remain at logic low state and the first through third switches S1-S3 remain deactivated.

At time instance T5, the second clock signal C2 transitions from logic low state to logic high state, thereby activating the second switch S2. During time period T5-T6, the second clock signal C2 remains at logic high state, and the first and third clock signals C1 and C3 remain at logic low state. Thus, the second switch S2 remains activated, and the first and third switches S1 and S3 remain deactivated. The second switch S2 performs sampling of the analog input signal Vin. Further, the second DAC 108b receives the sampled analog input signal Vin and generates the second analog output signal A2. During time period T4-T6, in reference to FIG. 1A, the first coarse ADC 102 performs coarse conversion of the analog input signal Vin to generate the first digital signal D1. In reference to FIG. 1B, the first coarse ADC 102 performs coarse conversion of the third analog output signal A3 to generate the first digital signal D1.

At time instance T6, the second clock signal C2 transitions from logic high state to logic low state, thereby deactivating the second switch S2. During time period T6-T7, the first through third clock signals C1-C3 remain at logic low state and the first through third switches S1-S3 remain deactivated. During time period T4-T7, the first converter 110a performs fine conversion (represented as "FC" in FIG. 2) of the first analog output signal A1 to generate the second digital signal D2. Further, the fine conversion of the second and third analog output signals A2 and A3 are represented as "FC" in FIG. 2.

At time instance T7, the first clock signal C1 transitions from logic low state to logic high state, thereby activating the first switch S1. During time period T7-T8, the first clock signal C1 remains at logic high state, and the second and third clock signals C2 and C3 remain at logic low state. Thus, the first switch S remains activated and the second and third switches S2 and S3 remain deactivated. The first switch S1 thus performs sampling of the analog input signal Vin. Further, the first DAC 108a receives the sampled analog input signal Vin and generates the first analog output signal A1. During time period T6-T8, in reference to FIG. 1A, the first coarse ADC 102 performs coarse conversion of the analog input signal Vin to generate the first digital signal D1. In reference to FIG. 1B, the first coarse ADC 102 performs coarse conversion of the second analog output signal A2 to generate the first digital signal D1.

At time instance T8, the first clock signal C1 transitions from logic high state to logic low state, thereby deactivating the first switch S1. During time period T8-T9, the first through third clock signals C1-C3 remain at logic low state and the first through third switches S1-S3 remain deactivated. During time period T6-T9, the second converter 110b performs fine conversion of the third analog output signal A3 to generate the fourth digital signal D4. During time period T6-T7, as the fourth duration partially overlaps with the sixth duration for half cycle of the input clock signal, the first and second converters 110a and 110b simultaneously perform fine conversion of the first and third analog output signals A and A3, respectively. Further, during time period T8-T13, the coarse conversion of the first analog output signal A1 and the fine conversion of the first analog output signal A1 occur in a similar manner as performed during time period T2-T7.

During time period T8-T10, the first converter 110a performs fine conversion of the second analog output signal A2 to generate the third digital signal D3. Further, during time period T8-T9, as the fifth duration partially overlaps with the sixth duration for half cycle of the input clock signal, the first and second converters 110a and 110b simultaneously perform fine conversion of the second and third analog output signals A2 and A3, respectively.

During time period T9-T12, the sampling of the analog input signal Vin and the coarse conversion of the third analog output signal A3 occur in a similar manner as performed during time period T3-T6. Further, during time period T11-T12, the sampling of the analog input signal Vin occurs in a similar manner as performed during time period T5-T6.

Figure 3A:
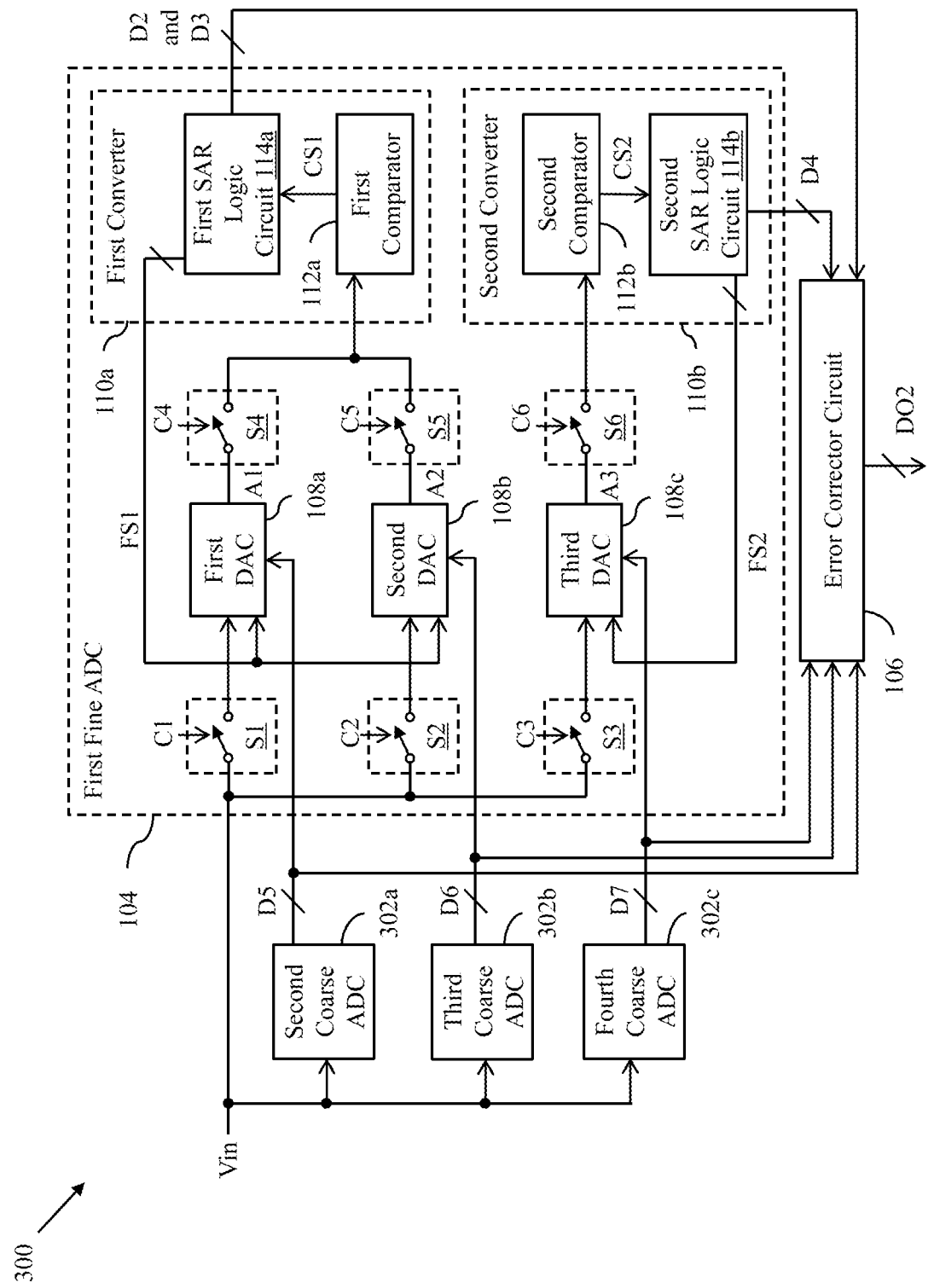
FIG. 3A is a block diagram of a second time-interleaved sub-ranging ADC in accordance with an embodiment of the present disclosure.

Referring now to FIG. 3A, a block diagram of a second time-interleaved sub-ranging ADC 300 in accordance with an embodiment of the present disclosure is shown. The second time-interleaved sub-ranging ADC 300 is configured to receive the analog input signal Vin generated by the first functional circuitry. The second time-interleaved sub-ranging ADC 300 is further configured to convert the analog input signal Vin to generate a second digital output signal DO2. The second time-interleaved sub-ranging ADC 300 may be further configured to provide the second digital output signal DO2 to the second functional circuitry.

The second time-interleaved sub-ranging ADC 300 includes second through fourth coarse ADCs 302a-302c, the first fine ADC 104, and the error corrector circuit 106. The first clock generator circuit may be internal or external to the second time-interleaved sub-ranging ADC 300.

The second through fourth coarse ADCs 302a-302c are configured to receive a set of analog signals that includes the analog input signal Vin. The second through fourth coarse ADCs 302a-302c are further configured to perform coarse conversion to generate third through fifth sets of coarse signals that include fifth through seventh digital signals D5-D7, respectively. Each of the second through fourth coarse ADCs 302a-302c generate the third through fifth sets of coarse signals in at least half cycle of the input clock signal, respectively. In one embodiment, each of the third through fifth sets of coarse signals are generated in half cycle of the input clock signal. In another embodiment, each of the third through fifth sets of coarse signals are generated in one cycle of the input clock signal. The fifth through seventh digital signals D5-D7 include fifth through seventh sets of bits such that the most significant bits (MSBs) of the second digital output signal DO2 correspond to at least one of the fifth through seventh sets of bits. In one example, each of the fifth through seventh sets of bits includes N-bits. The second through fourth coarse ADCs 302a-302c are coupled to the first fine ADC 104, and are configured to provide the third through fifth sets of coarse signals, i.e., the fifth through seventh digital signals D5-D7, respectively. In one example, the second through fourth coarse ADCs 302a-302c are implemented as flash ADCs.

The first fine ADC 104 functions in a similar manner as described in FIG. 1A. The error corrector circuit 106 is coupled with the second through fourth coarse ADCs 302a-302c and the first and second SAR logic circuits 114a and 114b, and is configured to receive the third through fifth sets of coarse signals, i.e., the fifth through seventh digital signals D5-D7, and the second through fourth digital signals D2-D4. The error corrector circuit 106 is further configured to generate the second digital output signal DO2 based on at least one of the third through fifth sets of coarse signals, i.e., the fifth through seventh digital signals D5-D7, and at least one of the second through fourth digital signals D2-D4. In one example, the error corrector circuit 106 receives the fifth and second digital signals D5 and D2. The error corrector circuit 106 generates the second digital output signal DO2 based on the fifth and second digital signals D5 and D2 in a manner similar to the generation of the first digital output signal DO1 as described in FIG. 1A. It will be apparent to those of skill in the art that when the error corrector circuit 106 receives one of the sixth and seventh digital signals D6 and D7 and one of the third and fourth digital signals D3 and D4, respectively, the error corrector circuit 106 generates the second digital output signal DO2 based on one of the sixth and seventh digital signals D6 and D7 and one of the third and fourth digital signals D3 and D4 in a manner similar to the generation of the second digital output signal DO2 based on the fifth and second digital signals D5 and D2.

Figure 3B:
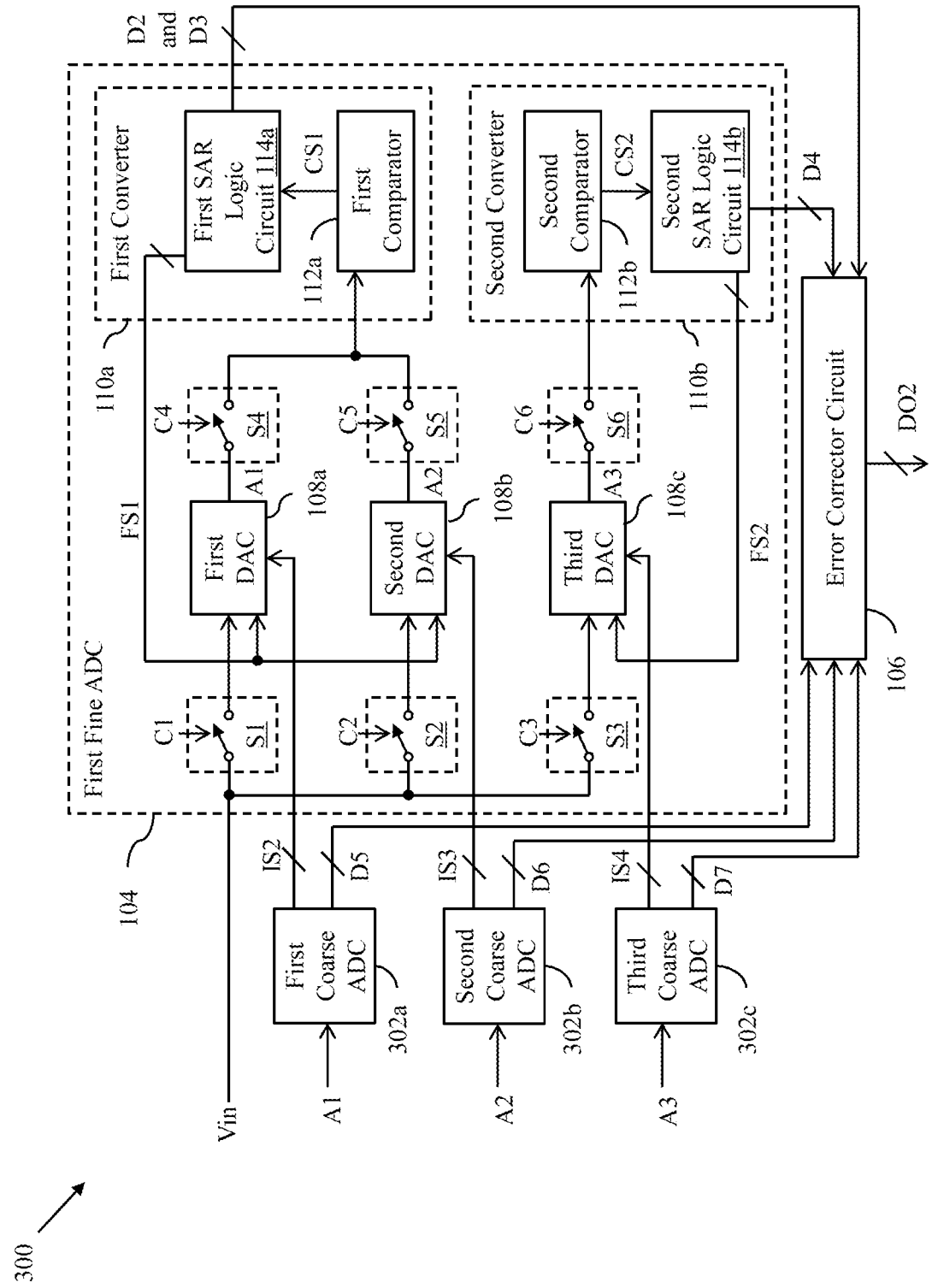
FIG. 3B is a block diagram of the second time-interleaved sub-ranging ADC of FIG. 3A in accordance with another embodiment of the present disclosure.

Referring now to FIG. 3B, a block diagram of the second time-interleaved sub-ranging ADC 300 in accordance with another embodiment of the present disclosure is shown. In the embodiment, the second through fourth coarse ADCs 302a-302c are implemented as SAR ADCs and share the first through third DACs 108a-108c of the first fine ADC 104 for performing corresponding coarse conversions, respectively. The second through fourth coarse ADCs 302a-302c are configured to receive a set of analog signals, i.e., the first through third analog output signals A1-A3, respectively. Based on the first through third analog output signals A1-A3, the second through fourth coarse ADCs 302a-302c are further configured to generate fourth through sixth sets of coarse signals, respectively. The fourth set of coarse signals includes a second intermediate signal IS2 and the fifth digital signal D5, the fifth set of coarse signals includes a third intermediate signal IS3 and the sixth digital signal D6, and the sixth set of coarse signals includes a fourth intermediate signal IS4 and the seventh digital signal D7. The second through fourth coarse ADCs 302a-302c include fourth through sixth comparators (not shown) and fourth through sixth SAR logic circuits (not shown), respectively.

The fourth through sixth comparators are coupled with the first through third DACs 108a-108c, respectively, and are configured to receive the first through third analog output signals A1-A3. The fourth through sixth comparators are further configured to generate fourth through sixth comparison signals (not shown) based on the first through third analog output signals A1-A3, respectively. It will be understood by those of skill in the art that the fourth through sixth comparators generate the fourth through sixth comparison signals in a manner similar to the generation of the first comparison signal CS1 by the first comparator 112a.

The fourth through sixth SAR logic circuits are coupled with the fourth through sixth comparators and the first through third DACs 108a-108c, respectively, and are configured to receive the fourth through sixth comparison signals, respectively. The fourth through sixth SAR logic circuits are further configured to generate the second through fourth intermediate signals IS2-IS4 based on the fourth through sixth comparison signals, respectively, and provide the second through fourth intermediate signals IS2-IS4 to the first through third DACs 108a-108c, respectively. The first through third DACs 108a-108c are configured to receive the second through fourth intermediate signals IS2-IS4 as the fourth through sixth sets of coarse signals that control the generation of the first through third analog output signals A1-A3 for performing corresponding coarse conversions, respectively. The fourth comparator and the fourth SAR logic circuit are configured to successively approximate the first analog output signal A1 to generate the fifth digital signal D5. The fifth comparator and the fifth SAR logic circuit are configured to successively approximate the second analog output signal A2 to generate the sixth digital signal D6. The sixth comparator and the sixth SAR logic circuit are configured to successively approximate the third analog output signal A3 to generate the seventh digital signal D7. The second through fourth coarse ADCs 302a-302c generate the fourth through sixth sets of coarse signals in at least half cycle of the input clock signal, respectively. The error corrector circuit 106 is coupled with the second through fourth coarse ADCs 302a-302c, and is configured to receive the fifth through seventh digital signals D5-D7 as the fourth through sixth sets of coarse signals. The first fine ADC 104 and the error corrector circuit 106 function in a similar manner as described in FIG. 3A.

Figure 4:
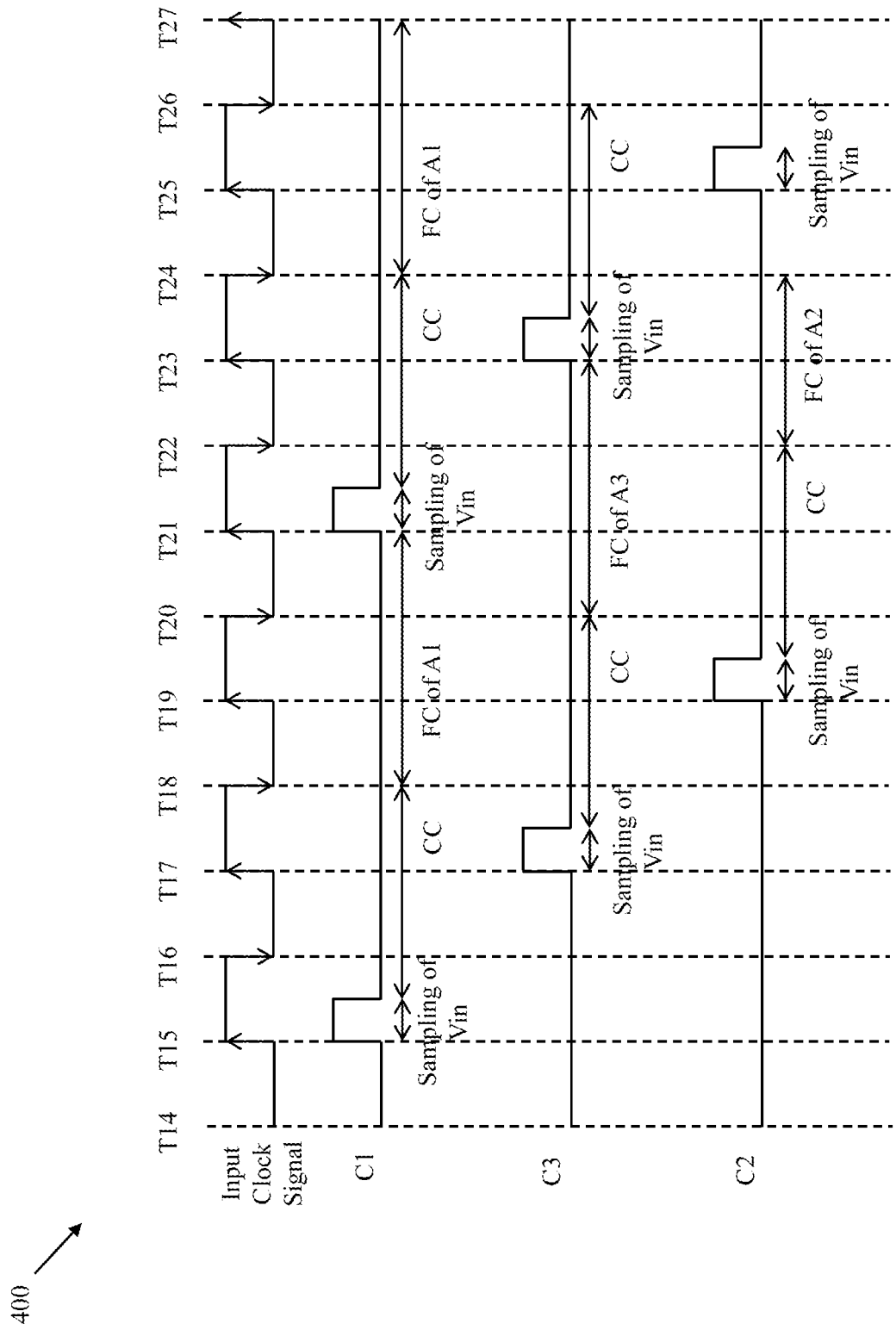
FIG. 4 is a timing diagram that illustrates an operation of the second time-interleaved sub-ranging ADC of FIGS. 3A and 3B in accordance with an embodiment of the present disclosure.

Referring now to FIG. 4, a timing diagram 400 illustrating an operation of the second time-interleaved sub-ranging ADC 300 of FIGS. 3A and 3B in accordance with an embodiment of the present disclosure is shown. In the embodiment, each of the first through third durations corresponds to one-fourth cycle of the input clock signal, each of the fourth and fifth durations corresponds to one and a half cycle of the input clock signal, and the sixth duration corresponds to one cycle of the input clock signal.

At time instance T14, the first through third clock signals C1-C3 are at logic low state. During time period T14-T15, the first through third clock signals C1-C3 remain at logic low state. Thus, the first through third switches S1-S3 are deactivated.

During time period T15-T21, the first switch S1 performs sampling of the analog input signal Vin for one fourth cycle of the input clock signal and the second coarse ADC 302a performs the coarse conversion (represented as "CC" in FIG. 4) of one of the analog input signal Vin or the first analog output signal A1 to generate the fifth digital signal D5 in one and one-fourth cycle of the input clock signal. Further, the first converter 110a performs the fine conversion (represented as "FC" in FIG. 4) of the first analog output signal A1 to generate the second digital signal D2 in one and a half cycle of the input clock signal. During time period T21-T27, the first switch S1 performs sampling of the analog input signal Vin, the second coarse ADC 302a performs the coarse conversion of one of the analog input signal Vin or the first analog output signal A1, and the first converter 110a performs the fine conversion of the first analog output signal A1 in a similar manner as performed during time period T15-T21. Further, the coarse conversion of the second and third analog output signals A2 and A3 are represented as "CC" in FIG. 4, and the fine conversion of the second and third analog output signals A2 and A3 are represented as "FC" in FIG. 4.

During time period T17-T23, the third switch S3 performs sampling of the analog input signal Vin for one fourth cycle of the input clock signal and the fourth coarse ADC 302c performs the coarse conversion of one of the analog input signal Vin or the third analog output signal A3 to generate the seventh digital signal D7 in one and one-fourth cycle of the input clock signal. Further, the second converter 110b performs the fine conversion of the third analog output signal A3 to generate the fourth digital signal D4 in one and a half cycle of the input clock signal. During time period T20-T21, as the fourth duration partially overlaps with the sixth duration for half cycle of the input clock signal, the first and second converters 110a and 110b simultaneously perform fine conversion of the first and third analog output signals A1 and A3, respectively. Further, during time period T23-T26, the third switch S3 performs sampling of the analog input signal Vin and the fourth coarse ADC 302c performs the coarse conversion of one of the analog input signal Vin or the third analog output signal A3 in a similar manner as performed during time period T17-T20.

During time period T19-T24, the second switch S2 performs sampling of the analog input signal Vin for one fourth cycle of the input clock signal, the third coarse ADC 302b performs the coarse conversion of one of the analog input signal Vin or the second analog output signal A2 to generate the sixth digital signal D6 in one and one-fourth cycle of the input clock signal. Further, the first converter 110a performs the fine conversion of the second analog output signal A2 to generate the third digital signal D3 in one cycle of the input clock signal. During time period T22-T23, as the fifth duration partially overlaps with the sixth duration for half cycle of the input clock signal, the first and second converters 110a and 110b simultaneously perform fine conversion of the second and third analog output signals A2 and A3, respectively. Further, during time period T25-T26, the second switch S2 performs sampling of the analog input signal Vin in a similar manner as performed during time period T19-T20.

It will be apparent to a person skilled in the art that although in the current embodiment, the first through third switches S-S3 perform sampling of the analog input signal Vin for one fourth cycle of the input clock signal, in an alternate embodiment, the first through third switches S1-S3 perform sampling of the analog input signal Vin for any time duration that is greater than zero and less than or equal to one cycle of the input clock signal.

Figure 5:
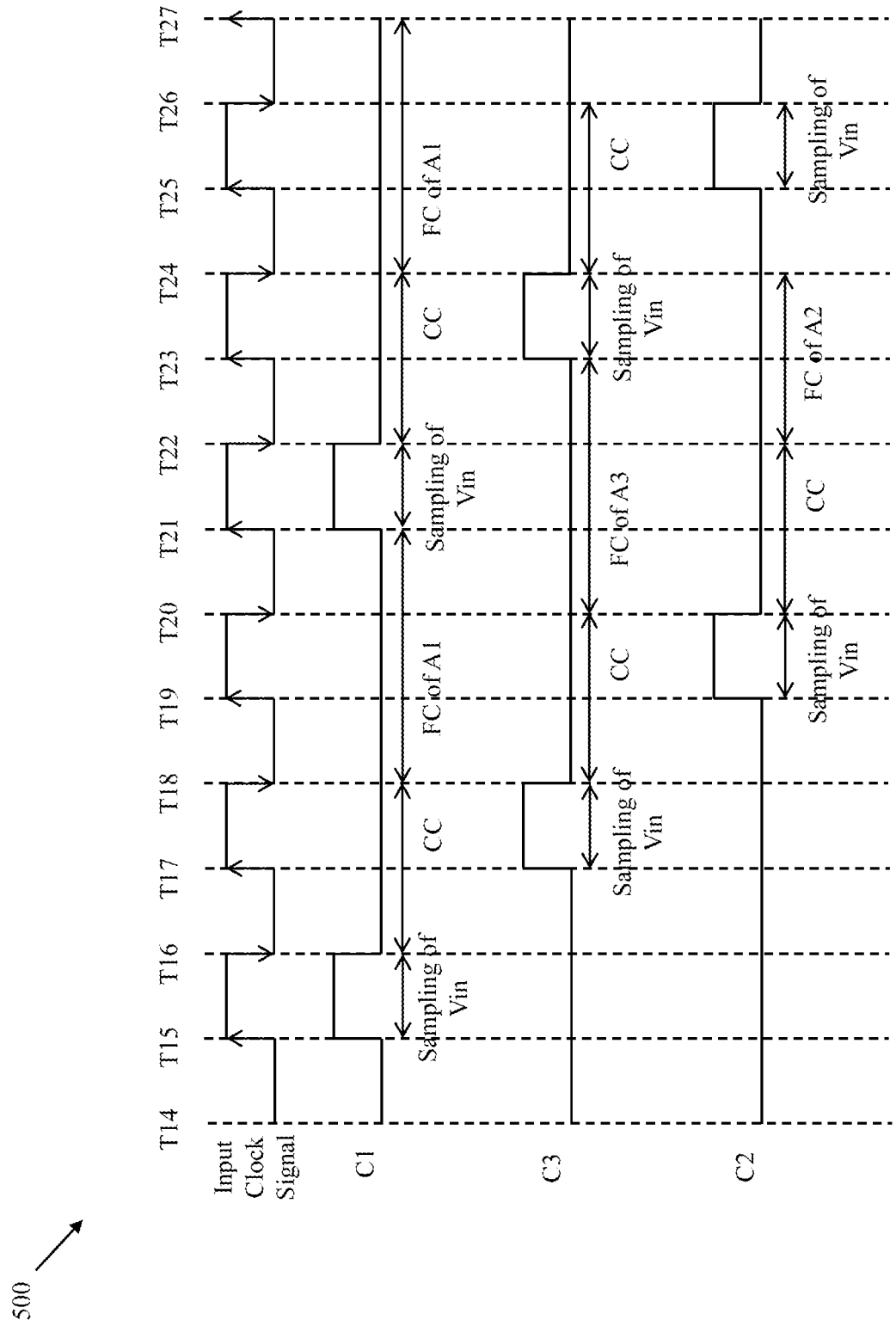
FIG. 5 is a timing diagram that illustrates an operation of the second time-interleaved sub-ranging ADC of FIGS. 3A and 3B in accordance with another embodiment of the present disclosure.

Referring now to FIG. 5, a timing diagram 500 illustrating an operation of the second time-interleaved sub-ranging ADC 300 of FIGS. 3A and 3B in accordance with another embodiment of the present disclosure is shown. In the embodiment, each of the first through third durations corresponds to half cycle of the input clock signal, each of the fourth and fifth durations corresponds to one and a half cycle of the input clock signal, and the sixth duration corresponds to one cycle of the input clock signal.

At time instance T14, the first through third clock signals C1-C3 are at logic low state. During time period T14-T15, the first through third clock signals C1-C3 remain at logic low state. Thus, the first through third switches S1-S3 are deactivated.

During time period T15-T21, the first switch S1 performs sampling of the analog input signal Vin for half cycle of the input clock signal and the second coarse ADC 302a performs the coarse conversion (represented as "CC" in FIG. 5) of one of the analog input signal Vin or the first analog output signal A1 to generate the fifth digital signal D5 in one cycle of the input clock signal. Further, the first converter 110a performs the fine conversion (represented as "FC" in FIG. 5) of the first analog output signal A1 to generate the second digital signal D2 in one and a half cycle of the input clock signal. During time period T21-T27, the first switch S1 performs sampling of the analog input signal Vin, the second coarse ADC 302a performs the coarse conversion of one of the analog input signal Vin or the first analog output signal A1, and the first converter 110a performs the fine conversion of the first analog output signal A1 in a similar manner as performed during time period T15-T21. Further, the coarse conversion of the second and third analog output signals A2 and A3 are represented as "CC" in FIG. 5, and the fine conversion of the second and third analog output signals A2 and A3 are represented as "FC" in FIG. 5.

During time period T17-T23, the third switch S3 performs sampling of the analog input signal Vin for half cycle of the input clock signal and the fourth coarse ADC 302c performs the coarse conversion of one of the analog input signal Vin or the third analog output signal A3 to generate the seventh digital signal D7 in one cycle of the input clock signal. Further, the second converter 110b performs the fine conversion of the third analog output signal A3 to generate the fourth digital signal D4 in one and a half cycle of the input clock signal. During time period T20-T21, as the fourth duration partially overlaps with the sixth duration for half cycle of the input clock signal, the first and second converters 110a and 110b simultaneously perform fine conversion of the first and third analog output signals A1 and A3, respectively. Further, during time period T23-T26, the third switch S3 performs sampling of the analog input signal Vin and the fourth coarse ADC 302c performs the coarse conversion of one of the analog input signal Vin or the third analog output signal A3 in a similar manner as performed during time period T17-T20.

During time period T19-T24, the second switch S2 performs sampling of the analog input signal Vin for half cycle of the input clock signal and the third coarse ADC 302b performs the coarse conversion of one of the analog input signal Vin or the second analog output signal A2 to generate the sixth digital signal D6 in one cycle of the input clock signal. Further, the first converter 110a performs the fine conversion of the second analog output signal A2 to generate the third digital signal D3 in one cycle of the input clock signal. During time period T22-T23, as the fifth duration partially overlaps with the sixth duration for half cycle of the input clock signal, the first and second converters 110a and 110b simultaneously perform fine conversion of the second and third analog output signals A2 and A3, respectively. Further, during time period T25-T26, the second switch S2 performs sampling of the analog input signal Vin in a similar manner as performed during time period T19-T20.

Figure 6:
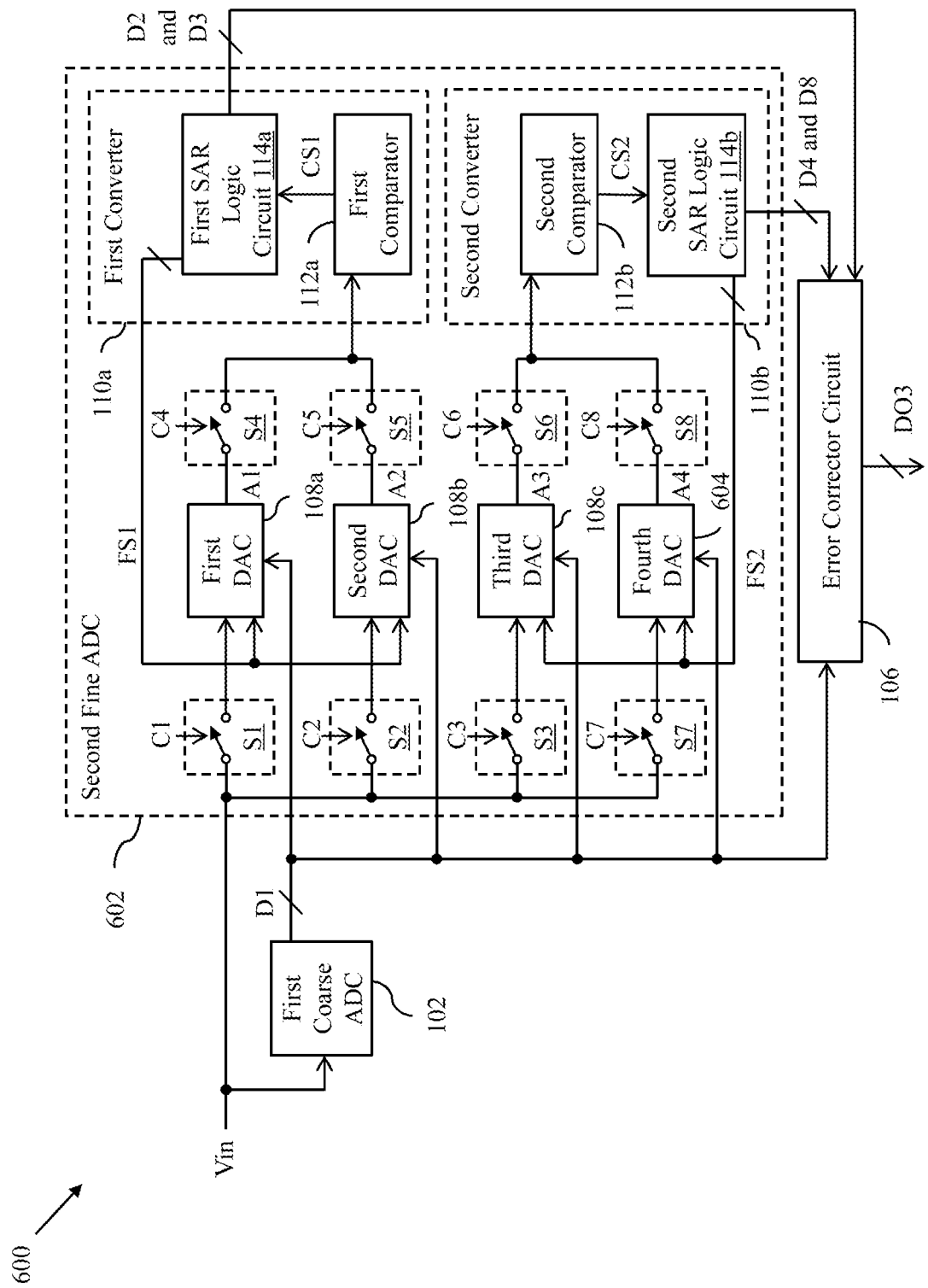
FIG. 6 is a block diagram of a third time-interleaved sub-ranging ADC in accordance with an embodiment of the present disclosure.

Referring now to FIG. 6, a block diagram of a third time-interleaved sub-ranging ADC 600 in accordance with an embodiment of the present disclosure is shown. The third time-interleaved sub-ranging ADC 600 is configured to receive the analog input signal Vin from the first functional circuitry. The third time-interleaved sub-ranging ADC 600 is further configured to convert the analog input signal Vin to generate a third digital output signal DO3. The third time-interleaved sub-ranging ADC 600 may be further configured to provide the third digital output signal DO3 to the second functional circuitry.

The third time-interleaved sub-ranging ADC 600 includes the first coarse ADC 102, a second fine ADC 602, and the error corrector circuit 106. The third time-interleaved sub-ranging ADC 600 may further include the first clock generator circuit. In the presently preferred embodiment, the first clock generator circuit further generates seventh and eighth clock signals C7 and C8 in a manner similar to the generation of the first through sixth clock signals C1-C6. The seventh and eighth clock signals C7 and C8 remain at logic high state for seventh and eighth durations of the input clock signal, respectively. The seventh duration and the first through third durations are non-overlapping durations, i.e., the seventh duration does not overlap with the first through third durations. The seventh duration corresponds to at most one cycle of the input clock signal. The eighth duration non-overlaps with the sixth duration, i.e., the sixth and eighth durations do not overlap with each other. The eighth duration partially overlaps with at least one of the fourth and fifth durations. Further, the eighth duration corresponds to at least one cycle of the input clock signal.

The first coarse ADC 102 functions in a similar manner as described in FIG. 1A. The second fine ADC 602 is coupled with the first functional circuitry for receiving the analog input signal Vin. Based on the first digital signal D1 and the analog input signal Vin, the second fine ADC 602 performs fine conversion to generate the second through fourth digital signals D2-D4 and an eighth digital signal D8 in the fourth through sixth durations and the eighth duration of the input clock signal, respectively. The eighth digital signal D8 includes an eighth set of bits such that least significant bits (LSBs) of the third digital output signal DO3 correspond to at least one of the second through fourth sets of bits and the eighth set of bits. In one example, the eighth set of bits includes M-bits. In the embodiment, the second fine ADC 602 further includes seventh and eighth switches S7 and S8 and a fourth DAC 604. The seventh and eighth switches S7 and S8 receive the seventh and eighth clock signals C7 and C8, respectively. The seventh switch S7 is structurally and functionally similar to the first switch S1 whereas the eighth switch S8 is structurally and functionally similar to the fourth switch S4. The fourth DAC 604 is structurally and functionally similar to the first through third DACs 108a-108c.

The seventh switch S7 is coupled with the first functional circuitry, and is configured to receive the analog input signal Vin. The seventh switch S7 receives and samples the analog input signal Vin when the seventh switch S7 is activated. The seventh switch S7 is coupled with the fourth DAC 604, and is further configured to provide the sampled analog input signal Vin to the fourth DAC 604.

The fourth DAC 604 is coupled to the first coarse ADC 102, and is configured to receive the first digital signal D1, and the sampled analog input signal Vin for the seventh duration of the input clock signal, i.e., when the seventh switch S7 is activated. Further, the fourth DAC 604 is configured to generate a fourth analog output signal A4 on receiving the sampled analog input signal Vin. The fourth DAC 604 is further configured to receive the second feedback signal FS2. The second feedback signal FS2 controls the fourth DAC 604 for generating the fourth analog output signal A4.

The eighth switch S8 is coupled with the fourth DAC 604, and is configured to receive the fourth analog output signal A4. The eighth switch S8 is activated in the eighth duration of the input clock signal. The eighth switch S8 receives and outputs the fourth analog output signal A4 when the fourth switch S4 is activated. The eighth switch S8 is coupled with the second converter 110*b*, and is further configured to provide the fourth analog output signal A4 to the second converter 110*b*.

The first converter 110*a* functions in a similar manner as described in FIG. 1A. The second converter 110*b* is coupled to the third DAC 108*c* and the fourth DAC 604 by way of the sixth switch S6 and the eighth switch S8, respectively, and is configured to receive at least one of the third and fourth analog output signals A3 and A4. The second converter 110*b* converts at least one of the third and fourth analog output signals A3 and A4 to generate at least one of the fourth and eighth digital signals D4 and D8 in the sixth and eighth durations, respectively. Further, the second converter 110*b* is configured to generate and provide the second feedback signal FS2 to the third DAC 108*c* and the fourth DAC 604 to control the third DAC 108*c* and the fourth DAC 604, respectively.

The second converter 110*b* includes the second comparator 112*b* and the second SAR logic circuit 114*b*. The second comparator 112*b* is coupled with the sixth and eighth switches S6 and S8. Thus, the second comparator 112*b* is coupled to the third DAC 108*c* and the fourth DAC 604 by way of the sixth and eighth switches S6 and S8, and is configured to receive the third and fourth analog output signals A3 and A4. The second comparator 112*b* is further configured to generate the second comparison signal CS2 based on at least one of the third and fourth analog output signals A3 and A4 in a manner similar to the generation of the first comparison signal CS1 by the first comparator 112*a*.

The second SAR logic circuit 114*b* is coupled with the second comparator 112*b*, the third DAC 108*c*, and the fourth DAC 604. The second SAR logic circuit 114*b* is configured to receive the second comparison signal CS2. The second comparator 112*b* and the second SAR logic circuit 114*b* are configured to successively approximate at least one of the third and fourth analog output signals A3 and A4 to generate at least one of the fourth and eighth digital signals D4 and D8, respectively. The second SAR logic circuit 114*b* is further configured to generate the second feedback signal FS2 at each cycle of the comparison clock signal, and provide the second feedback signal FS2 to the third DAC 108*c* and the fourth DAC 604. After each cycle of the comparison clock signal, the second SAR logic circuit 114*b* generates a corresponding bit of at least one of the fourth and eighth digital signals D4 and D8. Thus, after M-cycles of the comparison clock signal, the second SAR logic circuit 114*b* completes generation of the M-bits of at least one of the fourth and eighth digital signals D4 and D8. The second SAR logic circuit 114*b* generates the fourth and eighth digital signals D4 and D8 in the sixth and eighth durations of the input clock signal, i.e., when the sixth and eighth switches S6 and S8 are activated, respectively.

The error corrector circuit 106 is coupled with the first coarse ADC 102 and the first and second SAR logic circuits 114*a* and 114*b*, and is configured to receive the first digital signal D1 and at least one of the second through fourth digital signals D2-D4 and the eighth digital signal D8. The error corrector circuit 106 generates the third digital output signal DO3 based on the first digital signal D1 and at least one of the second through fourth digital signals D2-D4 and the eighth digital signal D8 in a manner similar to the generation of the first digital output signal DO1 as described in FIG. 1A. It will be apparent to a person skilled in the art that a fourth time-interleaved sub-ranging ADC (not shown) may be obtained by including the second through fourth coarse ADCs 302*a*-302*c* and a fifth coarse ADC (not shown) in place of the first coarse ADC 102, in the architecture of the third time-interleaved sub-ranging ADC 600. The working of the fourth time-interleaved sub-ranging ADC is similar to the second and third time interleaved sub-ranging ADCs 300 and 600 and will be understood by a person skilled in the art. It will be further apparent to a person skilled in the art that though in the current embodiment, the third time-interleaved sub-ranging ADC 600 includes four DACs and two converters, in another embodiment, the third time-interleaved sub-ranging ADC 600 may include more than four DACs and/or more than two converters. In one example, the third time-interleaved sub-ranging ADC 600 may be modified to include six DACs and three converters such that the fifth and sixth DACs (not shown) are coupled with a third converter (not shown). In another example, the third time-interleaved sub-ranging ADC 600 may be modified to include six DACs and two converters such that the first through third DACs 108*a*-108*c* are coupled with the first converter 110*a* and the fourth DAC 604 and the fifth and sixth DACs are coupled with the second converter 110*b*.

Figure 7:
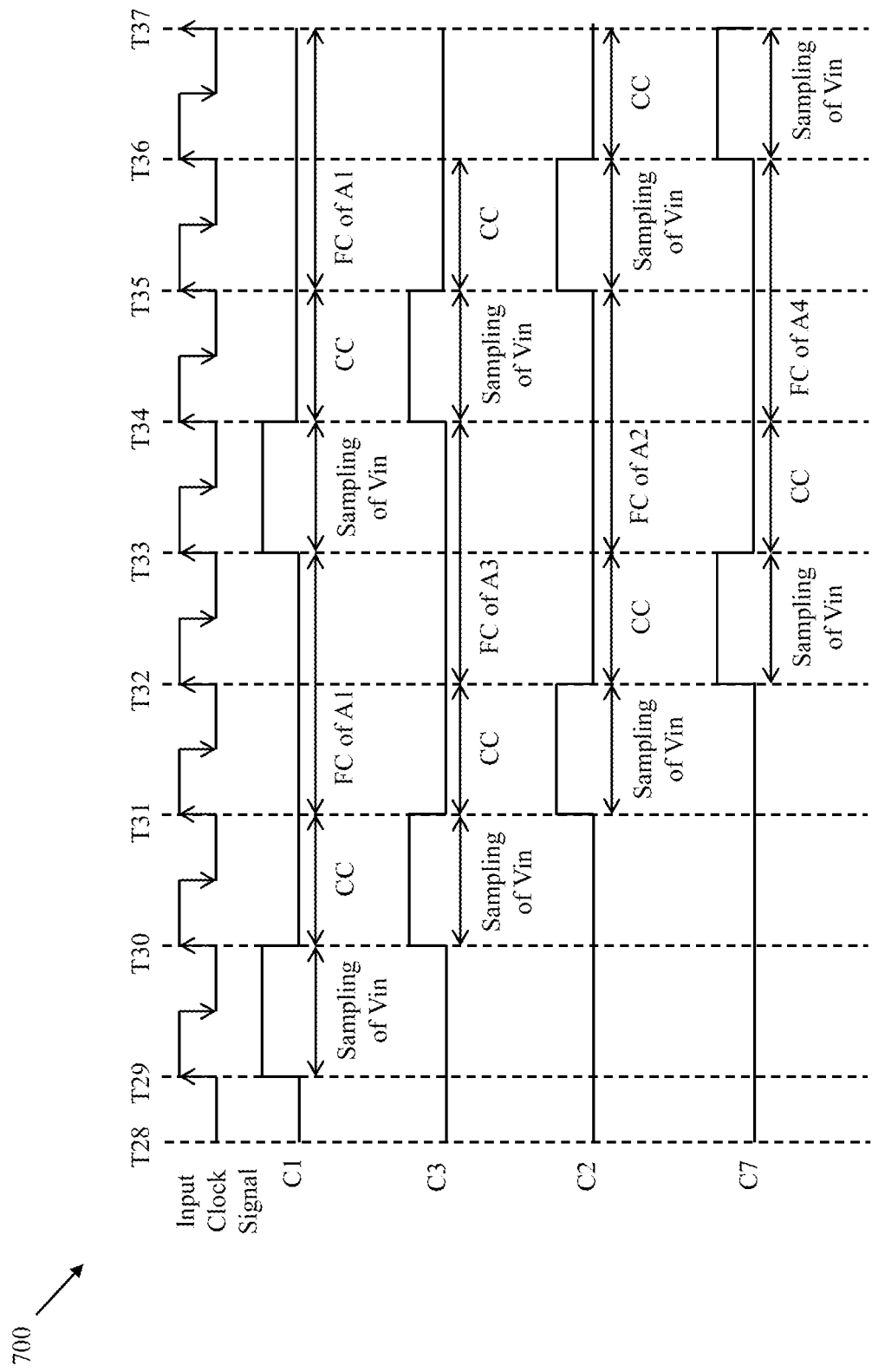
FIG. 7 is a timing diagram that illustrates an operation of the third time-interleaved sub-ranging ADC of FIG. 6 in accordance with an embodiment of the present disclosure.

Referring now to FIG. 7, a timing diagram 700 illustrating an operation of the third time-interleaved sub-ranging ADC 600 in accordance with an embodiment of the present disclosure is shown. In the embodiment, each of the first through third durations and the seventh duration corresponds to one cycle of the input clock signal, each of the fourth through sixth durations and the eighth duration corresponds to two cycles of the input clock signal.

At time instance T28, the first through third clock signals C1-C3 and the seventh clock signal C7 are at logic low state. During time period T28-T29, the first through third clock signals C1-C3 and the seventh clock signal C7 remain at logic low state. Thus, the first through third switches S1-S3 and the seventh switch S7 are deactivated.

During time period T29-T33, the first switch S1 performs sampling of the analog input signal Vin for one cycle of the input clock signal and the first coarse ADC 102 performs the coarse conversion (represented as "CC" in FIG. 7) of the analog input signal Vin to generate the first digital signal D1 in one cycle of the input clock signal. Further, the first converter 110*a* performs the fine conversion (represented as "FC" in FIG. 7) of the first analog output signal A1 to generate the second digital signal D2 in two cycles of the input clock signal. During time period T33-T37, the first switch S1 performs sampling of the analog input signal Vin, the first coarse ADC 102 performs the coarse conversion of the analog input signal Vin, and the first converter 110*a* performs the fine conversion of the first analog output signal A1 in a similar manner as performed during the time period T29-T33. Further, the fine conversion of the second through fourth analog output signals A2-A4 are represented as "FC" in FIG. 7.

During time period T30-T34, the third switch S3 performs sampling of the analog input signal Vin for one cycle of the input clock signal and the first coarse ADC 102 performs the coarse conversion of the analog input signal Vin to generate the first digital signal D1 in one cycle of the input clock signal. Further, the second converter 110b performs the fine conversion of the third analog output signal A3 to generate the fourth digital signal D4 in two cycles of the input clock signal. During time period T32-T33, as the fourth duration partially overlaps with the sixth duration for one cycle of the input clock signal, the first and second converters 110a and 110b simultaneously perform fine conversion of the first and third analog output signals A1 and A3, respectively. Further, during time period T34-T36, the third switch S3 performs sampling of the analog input signal Vin and the first coarse ADC 102 performs the coarse conversion of the analog input signal Vin in a similar manner as performed during time period T30-T32.

During time period T31-T35, the second switch S2 performs sampling of the analog input signal Vin for one cycle of the input clock signal and the first coarse ADC 102 performs the coarse conversion of the analog input signal Vin to generate the first digital signal D1 in one cycle of the input clock signal. Further, the first convener 110a performs the fine conversion of the second analog output signal A2 to generate the third digital signal D3 in two cycles of the input clock signal. During time period T33-T34, as the fifth duration partially overlaps with the sixth duration for one cycle of the input clock signal, the first and second converters 110a and 110b simultaneously perform fine conversion of the second and third analog output signals A2 and A3, respectively. Further, during time period T35-T37, the second switch S2 performs sampling of the analog input signal Vin and the first coarse ADC 102 performs the coarse conversion of the analog input signal Vin in a similar manner as performed during time period T31-T33.

During time period T32-T36, the seventh switch S7 performs sampling of the analog input signal Vin for one cycle of the input clock signal and the first coarse ADC 102 performs the coarse conversion of the analog input signal Vin to generate the first digital signal D1 in one cycle of the input clock signal. Further, the second converter 110b performs the fine conversion of the fourth analog output signal A4 to generate the eighth digital signal D8 in two cycles of the input clock signal. During time period T34-T35, as the fifth duration partially overlaps with the eighth duration for one cycle of the input clock signal, the first and second converters 110a and 110b simultaneously perform fine conversion of the second and fourth analog output signals A2 and A4, respectively. Further, during time period T35-T36, as the fourth duration partially overlaps with the eighth duration for one cycle of the input clock signal, the first and second converters 110a and 110b simultaneously perform fine conversion of the first and fourth analog output signals A1 and A4, respectively. In addition, during time period T36-T37, the seventh switch S7 performs sampling of the analog input signal Vin in a similar manner as performed during time period T32-T33.

The first through third time-interleaved sub-ranging ADCs 100, 300, and 600 utilize at least one full cycle of the input clock signal to perform fine conversion operation as compared to half cycles of an input clock signal that are utilized for performing each of the coarse and fine conversion operations by conventional sub-ranging ADCs. As need for implementing high powered components (that perform the aforementioned operations in half cycle of a clock signal) in the first through third time-interleaved sub-ranging ADCs 100, 300, and 600 is eliminated, the first through third time-interleaved sub-ranging ADCs 100, 300, and 600 consume low power and have low cost as compared to conventional sub-ranging ADCs that implement high-powered components. Further, multiple DACs (such as the first through third DACs 108a-108c and the fourth DAC 604) and multiple converters (such as the first and second converters 110a and 110b) form a partially time-interleaved architecture. Thus, the first through third time-interleaved sub-ranging ADCs 100, 300, and 600 operate at a higher speed as compared to the conventional sub-ranging ADCs. Additionally, a number of converters required (such as two converters) is less than the number of DACs (such as three or four DACs) as compared to the conventional sub-ranging ADCs implementing a time-interleaved architecture, due to which a size and a power consumption of the first through third time-interleaved sub-ranging ADCs 100, 300, and 600 is less as compared to conventional time-interleaved sub-ranging ADCs that include a number of converters that is same as a number of DACs.

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims.

The invention claimed is:

1. A sub-ranging analog-to-digital converter (ADC), comprising:
    a coarse ADC that is configured to generate a set of coarse signals; and
    a fine ADC coupled with the coarse ADC, wherein the fine ADC comprises:
        first through third digital-to-analog converters (DACs) that are configured to receive the set of coarse signals, receive an analog input signal for first through third durations of a clock signal, respectively, and generate first through third analog output signals, respectively, wherein the first through third durations are non-overlapping durations;
        a first converter that is coupled with the first and second DACs, and is configured to receive the first and second analog output signals and generate first and second digital signals in fourth and fifth durations of the clock signal, respectively, wherein the fourth duration non-overlaps with the fifth duration; and
        a second converter that is coupled with the third DAC, and is configured to receive the third analog output signal and generate a third digital signal in a sixth duration of the clock signal, wherein the sixth duration partially overlaps with at least one of the fourth and fifth durations.

2. The sub-ranging ADC of claim 1, further comprising:
    an error corrector circuit that is coupled with the coarse ADC, the first converter, and the second converter, and is configured to receive the set of coarse signals and the first through third digital signals, and generate a digital output signal based on the set of coarse signals and at least one of the first through third digital signals, wherein the coarse ADC is further configured to receive a set of analog signals such that the set of coarse signals is generated based on the set of analog signals, and wherein the coarse ADC generates the set of coarse signals in at least half cycle of the clock signal.

3. The sub-ranging ADC of claim 2, wherein the set of analog signals includes the analog input signal, and the set of coarse signals includes a fourth digital signal.

4. The sub-ranging ADC of claim 3, wherein the first through fourth digital signals include first through fourth sets of bits, respectively, and wherein most significant bits (MSBs) of the digital output signal correspond to the fourth set of bits, and least significant bits (LSBs) of the digital output signal correspond to at least one of the first through third sets of bits.

5. The sub-ranging ADC of claim 2, wherein the set of analog signals includes the first through third analog output signals, and the set of coarse signals includes an intermediate signal and a fourth digital signal, and wherein the first through third DACs receive the intermediate signal as the set of coarse signals, and the error corrector circuit receives the fourth digital signal as the set of coarse signals.

6. The sub-ranging ADC of claim 1, wherein the first converter comprises:
a first comparator that is coupled with the first and second DACs, and is configured to receive the first and second analog output signals and generate a first comparison signal based on at least one of the first and second analog output signals; and
a first successive approximation register (SAR) logic circuit that is coupled with the first comparator and the first and second DACs, and is configured to receive the first comparison signal, generate the first and second digital signals and a first feedback signal, and provide the first feedback signal to at least one of the first and second DACs, wherein the first feedback signal controls the first and second DACs for generating the first and second analog output signals, respectively.

7. The sub-ranging ADC of claim 1, wherein the second converter comprises:
a second comparator that is coupled with the third DAC, and is configured to receive the third analog output signal and generate a second comparison signal; and
a second SAR logic circuit that is coupled with the second comparator and the third DAC, and is configured to receive the second comparison signal, generate the third digital signal and a second feedback signal, and provide the second feedback signal to the third DAC, wherein the second feedback signal controls the third DAC for generating the third analog output signal.

8. The sub-ranging ADC of claim 1, wherein the fine ADC further comprises:
first through third switches that are coupled with the first through third DACs, respectively, and are activated in the first through third durations, respectively, wherein the first through third switches are configured to receive the analog input signal and provide the analog input signal to the first through third DACs, respectively.

9. The sub-ranging ADC of claim 1, wherein the fine ADC further comprises:
fourth and fifth switches that are coupled with the first and second DACs, respectively, and the first converter, and are activated in the fourth and fifth durations, respectively, wherein the fourth and fifth switches are configured to receive the first and second analog output signals and provide the first and second analog output signals to the first converter, respectively; and
a sixth switch that is coupled with the third DAC and the second converter, and is activated in the sixth duration, wherein the sixth switch is configured to receive the third analog output signal and provide the third analog output signal to the second converter.

10. The sub-ranging ADC of claim 1, wherein each of the first through third durations corresponds to at most one cycle of the clock signal, and each of the fourth through sixth durations corresponds to at least one cycle of the clock signal.

11. A sub-ranging analog-to-digital converter (ADC), comprising:

first through third coarse ADCs that are configured to receive a set of analog signals and generate first through third sets of coarse signals, respectively; and
a fine ADC coupled with the first through third coarse ADCs, the fine ADC comprising:
first through third digital-to-analog converters (DACs) that are coupled with the first through third coarse ADCs, respectively, and are configured to receive the first through third sets of coarse signals, and an analog input signal for first through third durations of a clock signal, respectively, and generate first through third analog output signals, respectively, wherein the first through third durations are non-overlapping durations;
a first converter that is coupled with the first and second DACs, and is configured to receive the first and second analog output signals and generate first and second digital signals in fourth and fifth durations of the clock signal, respectively, wherein the fourth duration non-overlaps with the fifth duration; and
a second converter that is coupled with the third DAC, and is configured to receive the third analog output signal and generate a third digital signal in a sixth duration of the clock signal, wherein the sixth duration partially overlaps with at least one of the fourth and fifth durations.

12. The sub-ranging ADC of claim 11, further comprising:
an error corrector circuit that is coupled with the first through third coarse ADCs, the first converter, and the second converter, and is configured to receive the first through third sets of coarse signals and the first through third digital signals, and generate a digital output signal based on at least one of the first through third sets of coarse signals and one of the first through third digital signals, respectively.

13. The sub-ranging ADC of claim 12, wherein the set of analog signals includes the analog input signal, and wherein the first set of coarse signals includes a fourth digital signal, the second set of coarse signals includes a fifth digital signal, and the third set of coarse signals includes a sixth digital signal.

14. The sub-ranging ADC of claim 13, wherein the first through sixth digital signals include first through sixth sets of bits, respectively, and wherein most significant bits (MSBs) of the digital output signal correspond to at least one of the fourth through sixth sets of bits, and least significant bits (LSBs) of the digital output signal correspond to at least one of the first through third sets of bits.

15. The sub-ranging ADC of claim 12, wherein the set of analog signals includes the first through third analog output signals such that the first through third coarse ADCs receive the first through third analog output signals, respectively, wherein the first set of coarse signals includes a fourth digital signal and a first intermediate signal, the second set of coarse signals includes a fifth digital signal and a second intermediate signal, and the third set of coarse signals includes a sixth digital signal and a third intermediate signal, and wherein the first through third DACs receive the first through third intermediate signals as the first through third sets of coarse signals, respectively, and the error corrector circuit receives the fourth through sixth digital signals as the first through third sets of coarse signals, respectively.

16. The sub-ranging ADC of claim 11, wherein the first converter comprises:
a first comparator that is coupled with the first and second DACs, and is configured to receive the first and second analog output signals and generate a first comparison signal based on at least one of the first and second analog output signals; and a first successive approximation register (SAR) logic circuit that is coupled with the first comparator and the first and second DACs, and is configured to receive the first comparison signal, generate the first and second digital signals and a first feedback signal, and provide the first feedback signal to at least one of the first and second DACs, wherein the first feedback signal controls the first and second DACs for generating the first and second analog output signals, respectively.

17. The sub-ranging ADC of claim 11, wherein the second converter comprises:

a second comparator that is coupled with the third DAC, and is configured to receive the third analog output signal and generate a second comparison signal; and a second SAR logic circuit that is coupled with the second comparator and the third DAC, and is configured to receive the second comparison signal, generate the third digital signal and a second feedback signal, and provide the second feedback signal to the third DAC, wherein the second feedback signal controls the third DAC for generating the third analog output signal.

18. The sub-ranging ADC of claim 11, wherein the fine ADC further comprises:

first through third switches that are coupled with the first through third DACs, respectively, and are activated in the first through third durations, respectively, wherein the first through third switches are configured to receive the analog input signal and provide the analog input signal to the first through third DACs, respectively.

19. The sub-ranging ADC of claim 11, wherein the fine ADC further comprises:

fourth and fifth switches that are coupled with the first and second DACs, respectively, and the first converter, and are activated in the fourth and fifth durations, respectively, wherein the fourth and fifth switches are configured to receive the first and second analog output signals and provide the first and second analog output signals to the first converter, respectively; and a sixth switch that is coupled with the third DAC and the second converter, and is activated in the sixth duration, wherein the sixth switch is configured to receive the third analog output signal and provide the third analog output signal to the second converter.

20. The sub-ranging ADC of claim 11, wherein each of the first through third durations corresponds to at least one-fourth cycle of the clock signal, and each of the fourth through sixth durations corresponds to at least one cycle of the clock signal, and wherein each of the first through third coarse ADCs generates the first through third sets of coarse signals in at least half cycle of the clock signal, respectively.

* * * * *